United States Patent
Gueta et al.

(10) Patent No.: US 9,812,209 B2
(45) Date of Patent: Nov. 7, 2017

(54) SYSTEM AND METHOD FOR MEMORY INTEGRATED CIRCUIT CHIP WRITE ABORT INDICATION

(71) Applicant: SanDisk Technologies LLC, Plano, TX (US)

(72) Inventors: Asaf Gueta, Or-Yehuda (IL); Inon Cohen, Oranit (IL); Arie Star, Hadera (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/584,339

(22) Filed: May 2, 2017

(65) Prior Publication Data

US 2017/0236590 A1    Aug. 17, 2017

Related U.S. Application Data

(62) Division of application No. 14/718,488, filed on May 21, 2015, now Pat. No. 9,659,619.

(51) Int. Cl.
G11C 16/04    (2006.01)
G11C 16/22    (2006.01)
(Continued)

(52) U.S. Cl.
CPC ........ *G11C 16/225* (2013.01); *G06F 13/1668* (2013.01); *G11C 7/24* (2013.01);
(Continued)

(58) Field of Classification Search
CPC ...... G06F 13/1668; G11C 16/105; G11C 7/24
See application file for complete search history.

(56) References Cited

U.S. PATENT DOCUMENTS 5,313,585 A * 5/1994 Jeffries .................. G11B 19/02
711/112
5,313,626 A * 5/1994 Jones .................. G06F 11/1092
714/5.11

(Continued)

OTHER PUBLICATIONS

Office Action from corresponding U.S. Appl. No. 14/718,488 dated Oct. 6, 2016; 7 pgs.

*Primary Examiner* — Tuan T Nguyen
(74) *Attorney, Agent, or Firm* — Brinks Gilson & Lione

(57) ABSTRACT

Systems and methods for detecting a command execution abort are disclosed. Power failure may abort the writing of data in a memory device prematurely, resulting in potential data corruption. A memory device controller in the memory device sends commands, such as write or erase commands, to one or more memory integrated circuit chips. Along with executing the commands, the memory integrated circuit chips track execution of the commands by storing the address at which the command is being executed along with flag(s) indicative of the progress executing the command (e.g., command has begun and/or completed execution). When a power failure occurs, the memory device controller may poll the memory integrated circuit chips for the address/flags information to determine whether (or where) the command abort occurred. Thus, relying on the address/flag(s), the memory device controller may more quickly or easily determine whether a command abort has occurred.

20 Claims, 9 Drawing Sheets

(51) Int. Cl.
*G11C 7/24* (2006.01)
*G11C 16/10* (2006.01)
*G11C 16/14* (2006.01)
*G06F 13/16* (2006.01)
*G11C 16/30* (2006.01)

(52) U.S. Cl.
CPC ............ *G11C 16/10* (2013.01); *G11C 16/105* (2013.01); *G11C 16/14* (2013.01); *G11C 16/22* (2013.01); *G11C 16/30* (2013.01)

(56) References Cited

U.S. PATENT DOCUMENTS

| | | |
|---|---|---|
| 5,509,134 A | 4/1996 | Fandrich et al. |
| 5,530,960 A * | 6/1996 | Parks ..................... G06F 11/22 710/5 |
| 5,909,701 A | 6/1999 | Jeddeloh |
| 8,266,391 B2 | 9/2012 | Tomlin et al. |
| 8,547,775 B2 | 10/2013 | Yoko |
| 8,832,358 B2 * | 9/2014 | Chang ................. G06F 12/0246 365/185.03 |
| 2008/0065818 A1 | 3/2008 | Lin et al. |
| 2009/0070748 A1 | 3/2009 | Lin et al. |
| 2013/0205066 A1 | 8/2013 | Dusija et al. |
| 2014/0192583 A1 | 7/2014 | Rajan et al. |
| 2015/0347025 A1 * | 12/2015 | Law ..................... G06F 3/0611 711/103 |
| 2016/0343448 A1 | 11/2016 | Gueta et al. |

\* cited by examiner

SYSTEM AND METHOD FOR MEMORY INTEGRATED CIRCUIT CHIP WRITE ABORT INDICATION

REFERENCE TO RELATED APPLICATION

This application is a divisional of U.S. application Ser. No. 14/718,488, filed on May 21, 2015, which is incorporated by reference herein in its entirety.

TECHNICAL FIELD

This application relates generally to storage devices. More specifically, this application relates to a memory integrated circuit chip setting one or more flags when executing commands (such as write commands) in order for the memory integrated circuit chip to indicate whether (and where) a write abort has occurred.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A memory device includes a memory device controller and one or more memory integrated circuit chips in communication with the memory device controller. The memory device controller sends commands to the memory integrated circuit chips for execution. For example, the memory device controller may send write commands to store data in the memory integrated circuit chips. One type of memory device is binary and Multi-Level Cell (MLC) NAND flash memory capable of high data storage densities and high performance. In NAND flash, a "page" or group of bits at a time is written to the non-volatile memory.

However, a power failure (such as due to hot removal, brownout, blackout or the like) may cause data corruption or loss when writing data to memory. In flash memory, if a power failure occurs during a write cycle/program operation, something less than all of the bits of the page may be programmed successfully in the non-volatile memory. When the page containing unsuccessfully programmed bits is read back, some bits may have the new value, some will have the old value and, as a result, the page may be corrupted.

Overview

In one aspect, a memory integrated circuit chip is disclosed. The memory integrated circuit chip is configured to communicate with a memory device controller and includes: a command receiving module configured to receive a command from the memory device controller; a command execution module configured to execute the command received; and an indicator module configured to store an address and an associated indicator in the memory integrated circuit chip, the indicator indicative of execution of the command by the memory integrated circuit chip at the address.

In another aspect, a method for a memory integrated circuit chip to communicate with a memory device controller is disclosed. The method is performed by the memory integrated circuit chip and includes: receiving a command from the memory device controller; executing the command at an address within the memory integrated circuit chip; storing in the memory integrated circuit chip the address and one or more indicators, the one or more indicators being stored associated with the address and indicative of execution of the command; and sending the address and the one or more indicators to the memory device controller.

In yet another aspect, a memory device controller is disclosed. The memory device controller includes: a memory integrated circuit chip inquiry module configured to send an inquiry to a memory integrated circuit chip, the inquiry indicative of requesting the memory integrated circuit chip to send one or more flag values and associated addresses, the one or more flag values indicative of execution of a command at the associated addresses by the memory integrated circuit chip; and an abort identification module configured to identify, based on the one or more flag values and associated addresses, a section of memory within the memory integrated circuit chip containing valid data resulting from proper execution of the command or invalid data resulting from aborted execution of the command.

In still another aspect, a method for a memory device controller to communicate with a memory integrated circuit chip in order to determine whether a command abort has occurred is disclosed. The method is performed by the memory device controller and includes: sending a polling command to the memory integrated circuit chip requesting information as to execution of a command by the memory integrated circuit chip; responsive to sending the polling command, receiving address and one or more indicators indicative of the execution of the command by the memory integrated circuit chip; and determining, based on the address and the one or more indicators, a section of memory within the memory integrated circuit chip containing valid data resulting from proper execution of the command or invalid data resulting from aborted execution of the command.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1A:
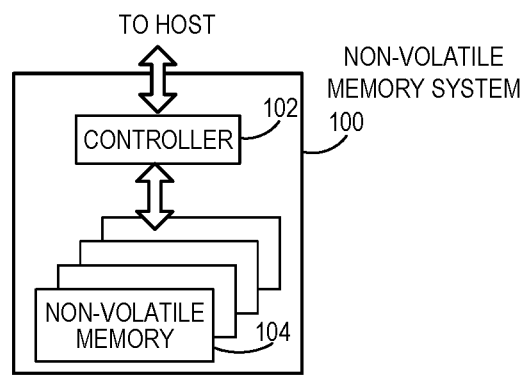
FIG. 1A is a block diagram of an example non-volatile memory system.

A memory device may include a memory device controller and memory. The memory may be in the form of one or more memory integrated circuit chips. The memory device controller may send commands to the memory integrated circuit chip(s) for execution. Examples of commands include a write command for writing data to the memory in the memory integrated circuit chip(s) and an erase command for erasing for memory in the memory integrated circuit chip(s). Other commands are contemplated. As discussed in more detail below, the memory device controller may send the command, such as the write command, in response to receiving a command from a host device. Alternatively, the memory device controller may determine to send the command, such as the erase command, in response to the firmware executed by the memory device controller.

When operating the memory device, a power failure may cause data corruption or loss when executing the command, such as a programmed operation (e.g., when executing a write command or an erase command). In one embodiment, the memory (such as one, some, or all of the memory integrated circuit chips) includes command execution logic to store one or more indicators as to the execution of the command. In this regard, the one or more indicators are indicative of whether a command abort (such as a write abort or an erase abort) has occurred during execution of the command. The one or more indicators may comprise addresses and one or more flags indicative of execution of the command at the addresses. The memory device controller may use the addresses and the associated one or more indicators in order to more quickly determine whether (and where) the write abort occurred. For example, the memory device controller may identify the exact location of these used blocks in the memory integrated circuit chips at the last write abort operation and to identify the last written (e.g., the last valid) page within the used block before the power down has occurred.

Thus, in one embodiment, the memory integrated circuit chip(s) may include the intelligence to monitor the execution (such as via one or more indicators) and to send addresses and the associated one or more indicators to the memory device controller. In turn, the memory device controller may use the addresses/associated one or more indicators sent from the memory integrated circuit chip(s) to assess whether the write abort occurred and/or where the write abort occurred (or did not occur). Thus, by using intelligence resident on the memory integrated circuit chip(s), firmware overhead on the memory device controller may be reduced.

In one embodiment, in response to receiving the command, the memory stores the addresses and the associated one or more indicators. For example, the memory integrated circuit chip may receive a write command. The write command may include one or more addresses indicative of addresses in the memory integrated circuit chip and data for storage at the one or more addresses. In response to receipt of the write command, the memory integrated circuit chip may store the indicator(s) and addresses. As another example, the memory integrated circuit chip may receive an erase command. The erase command may include one or more addresses indicative of addresses in the memory integrated circuit chip for erase. In the example of NAND flash memory, an erase may be considered the equivalent of a write operation of logic "1". In response to receipt of the erase command, the memory integrated circuit chip may store the indicator(s) and addresses.

In a more specific embodiment, the indicators stored in the memory integrated circuit chip may comprise multiple flags that are indicative of different stages of execution of the command at the address associated with the flags. For example, a first flag may be indicative of whether the execution of the command has begun, and a second flag may be indicative of whether the execution of the command has completed. More specifically, a first value for the first flag (e.g., logic "1") may be indicative that the command has not begun execution at the associated address and a second value for the first flag (e.g., logic "0") may be indicative that the command has begun execution at the associated address. Likewise, the first value for the second flag (e.g., logic "1") may be indicative that the command has not completed execution at the associated address and the second value for the second flag (e.g., logic "0") may be indicative that the command has completed execution at the associated address.

The address stored that is associated with the flag(s) may be indicative of a section of memory at which the command is being executed. For example, in page-by-page programming, the address may be indicative of a page within the memory. In one embodiment, the address may comprise 5 or 6 bytes, identifying the die/plane/block/page at which the command is being executed. Other types of programming are contemplated. In this regard, addresses (other than identifying a page) are contemplated.

The memory integrated circuit chip may store addresses and associated indicators for the last N operations (such as the last N write operations). N may be a non-zero number, such as 1, 2, 4 or 8, and may be configurable in defined range. For example, the memory integrated circuit chip may store addresses/indicators for the last N pages for programming.

Further, in one embodiment, the addresses/indicators may be stored for a specific type of operations performed by the memory integrated circuit chip. For example, the addresses/indicators may be stored for write operations and/or for erase operations. In an alternate embodiment, the addresses/indicators may be stored depending on the type of memory the operation affects. For example, the memory integrated circuit chip may store the indicators for operations that affect a specific type of memory, such as single-level cell (SLC) blocks, multi-level cell (MLC) blocks, triple-level cell (TLC) blocks, etc. Alternatively, the addresses/indicators may be stored regardless of the type of memory the operation affects (e.g., for all NAND processes affecting SLC, MLC, TLC, etc.).

The timing for storage of values for the addresses/indicators may depend on the sequence of operation. In one embodiment, the address is stored prior to the first flag. For example, during the write operation, before the actual data write program is performed, the address of the program operation, which may be several bytes, is programmed in a dedicated place in the memory. Only after the address program is finished, an indication called PSF (Program Started Flag) is programmed, also in a dedicated area in the memory. Alternatively, the flag is stored contemporaneously or prior to storage of the address.

The dedicated area in memory may be high endurance NAND, such as one or more single-level cell blocks. When the dedicated area is filled by writing the address and flag information, the dedicated area may be erased. In this regard, the dedicated area may be subject to many program erase cycles in the lifetime of the device.

In one embodiment, the dedicated area may comprise dual dedicated blocks. Thus, when one block is filled with address/flag information, the second block is already erased and ready to be programmed with address/flag information. Though, other ways of managing the dedicated area are contemplated.

The address/flag information may be stored in the dedicated area in one of several ways. In one embodiment, the address/flag information may be redundantly stored. In particular, a redundant set of blocks may be added to ensure data integrity of the address/flag information. For example, when too many operations are made (resulting in severely damaged cells), the memory device controller may still use the address/flag information stored in the redundant set of blocks.

In an alternative embodiment, the address/flag information and its complement may be stored. More specifically, for each byte of address/flag information data, the address/flag information is stored (Data) and the inverse of the address/flag information is stored (Data), for example, with the Data+~Data=0×FF. In this way, the memory integrated circuit chip may independently determine whether there is an error in the address/flag information.

Likewise, only after the address and the flag are stored in the dedicated place in the memory, execution of the command begins. For example, after the address and the PSF are programmed, the write command may begin execution by writing to one or more address in the memory integrated circuit chip. Once the command execution is finished (and in one embodiment only after the command execution is finished), a second flag called PEF (Program Ended Flag) is programmed. Similar to the address and the first flag, the second flag may be stored in a dedicated place in the memory. Thus, the trigger for programming PEF is the end of the command execution (e.g., the end of the data program for a write command).

Thereafter, the addresses/indicators may be sent from the memory integrated circuit chip(s) to the memory device controller. In one embodiment, the memory integrated circuit chip(s) may send the one or more indicators in response to a request sent from the memory device controller. In an alternate embodiment, the memory integrated circuit chip(s) may send the one or more indicators without prompting from the memory device controller.

For example, the memory device controller may poll the memory integrated circuit chip(s) for the addresses/indicators stored therein. In one embodiment, the decision by the memory device controller to poll the memory integrated circuit chip(s) for the addresses/indicators is in response to the memory device controller determining that a command abort has occurred. In one instance, the memory device controller may make the command abort determination after power-up during mount. Alternatively, the memory device controller may make the command abort determination in the middle of operation. Alternatively, the memory device controller may poll the memory integrated circuit chip(s) in response to mounting with a host device. Thus, in one embodiment, polling of the memory integrated circuit chip(s) occurs after each mounting of the memory device with the host device.

Regardless, in response to the determination that a command abort has occurred, the memory device controller may poll the one or more memory integrated circuit chips for the indicator(s). Again, the poll may be either in the midst of regular operation or after power up during mount. The poll by the memory device controller may comprise a dedicated command for command abort indication information.

Responsive to the poll, the memory integrated circuit chip(s) may send the addresses/indicator(s). Based on the addresses/indicator(s) sent from the memory integrated circuit chip(s), the memory device controller may determine one or both of the following: whether there was a command execution abort and/or the address(es) at which valid or invalid data are present. In particular, the memory device controller may determine if a write abort occurred during the last write operation. If so, the memory device controller may further identify the exact location of these used blocks in the memory (resident in the memory integrated circuit chips) at the last write abort operation and/or identify the last written (last valid) page within the used block before the power down has occurred. Thus, the memory device controller may indicate to the host device (either during mount time or thereafter) whether the memory device underwent a write abort.

In a more specific embodiment, the memory device controller may examine the values programmed in the PSF and PEF to determine whether the command was executed properly. For example, in the event that the PSF is programmed (meaning that the command began execution) and the PEF is programmed (meaning that the command completed execution), the command at the address associated with the PSF and PEF was executed properly. As another example, in the event that the PSF is programmed (meaning that the command began execution) but the PEF is not programmed (meaning that the command did not complete execution), the programming of the flags indicate that the command at the address associated with the PSF and PEF was not executed properly (and that the memory integrated circuit chip at the address associated with the PSF and PEF suffered from a write abort during the command execution process). In still another example, in the event that the PSF is not programmed (meaning that the command has not begun execution), the command at the address associated with the PSF and PEF was not even begun. Thus, both PSF and PEF are indicative whether a write abort occurred.

In this way, in the event of a power failure, the memory (such as one, some, or all of the memory integrated circuit chips) may send the one or more indicators to the memory device controller. The memory device controller may thus find the last good page that was programmed and/or the first non-valid page that was in the midst of programming, thereby resulting in reducing mount time. Thus, based on the one or more indicators, the memory device controller may determine whether the command was executed properly, and if not, the address at which the command was not executed properly.

Referring to the figures, FIG. 1A is a block diagram illustrating a non-volatile memory system. The non-volatile memory system 100 includes a controller 102 and non-volatile memory that may be made up of one or more non-volatile memory die 104. The non-volatile memory die may comprise one or more memory integrated circuit chips. One or both of the controller 102 and non-volatile memory die 104 may use a regulated voltage. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program (e.g., write), and erase operations to non-volatile memory die 104.

The controller 102 (which may in one embodiment be a flash memory controller) can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. For example, the hardware and/or firmware may be configured for analysis of the incoming data stream (such as for bandwidth and/or consistency) and for determination whether to use hybrid blocks, as discussed in more detail below. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. One example of non-volatile memory die 104 may comprise a memory integrated circuit chip. The memory cells can take the form of solid-state (e.g., flash) memory cells and can be one-time programmable, few-time programmable, or many-time programmable. As discussed above, the memory cells can also be single-level cells (SLC), multiple-level cells (MLC), triple-level cells (TLC), quadruple-level cells (QLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A non-volatile memory system 100 includes a single channel between controller 102 and non-volatile memory die 104, the subject matter described herein is not limited to having a single memory channel. For example, in some NAND memory system architectures such as illustrated in FIGS. 1B-C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
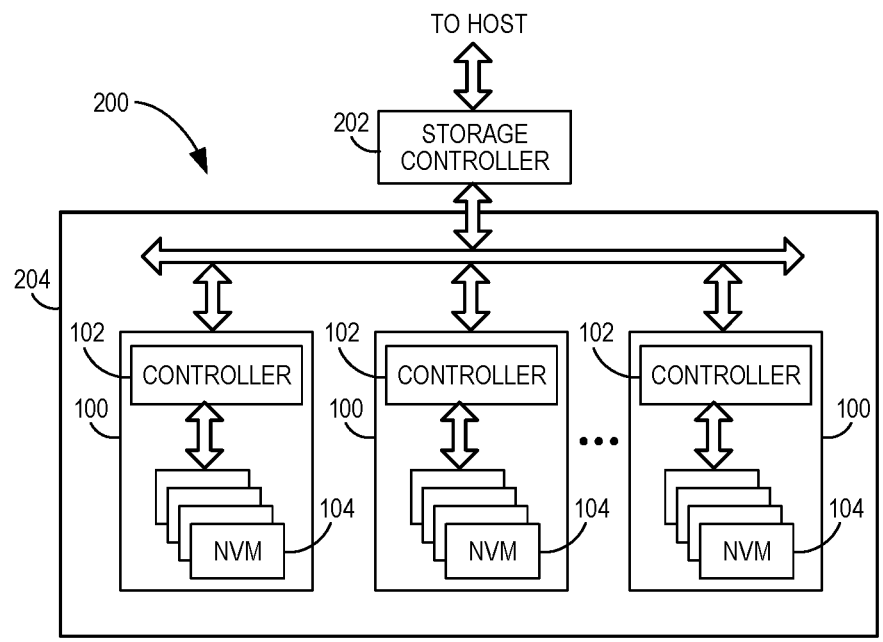
FIG. 1B is a block diagram illustrating an exemplary storage module.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
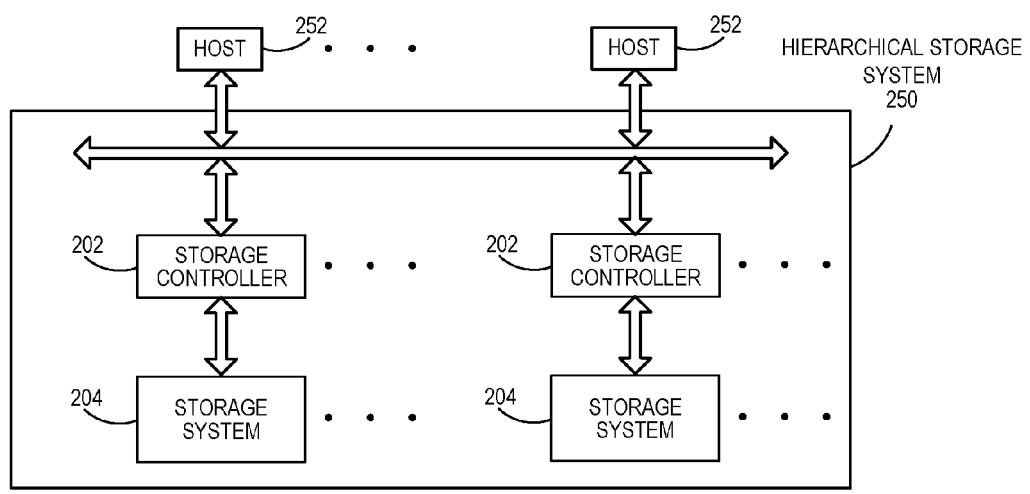
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
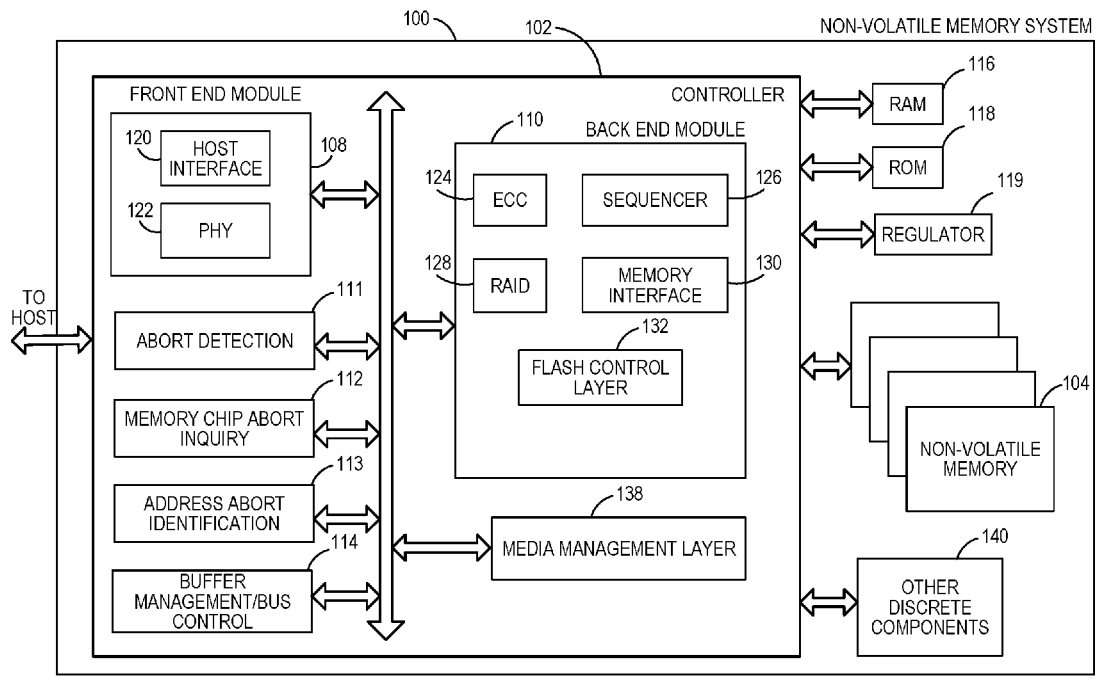
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include an abort detection module 111, a memory chip abort inquiry module 112, and an address abort identification module 113. As explained in more detail below, the abort detection module 111 may determine whether an abort (such as a write abort) has occurred. The controller 102 may trigger execution of the abort detection module 111 upon power-up, for example. In response to the abort detection module 111 determining that an abort has occurred, the memory chip abort inquiry module 112 may send an inquiry to non-volatile memory 104, such as to one or more of the memory integrated circuit chips. In response to the inquiry, the non-volatile memory 104 may send information, such as one or more indicators, to the controller 102. The address abort identification module 113, using the one or more indicators, may determine address(es) in the non-volatile memory at which an abort occurred and/or may determine address(es) at which the command was executed successfully. For example, the address abort identification module 113 may find the last good page at which the write command was properly executed.

While in some implementations the abort detection module 111, the memory chip abort inquiry module 112, and the address abort identification module 113 may be part of the controller 102, in other implementations, all or a portion of the abort detection module 111, the memory chip abort inquiry module 112, and the address abort identification module 113 may be discrete components, separate from the controller 102, that interface with the controller 102

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, eMMC I/F, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102.

In alternative embodiments, one or more of the physical layer interface 122, RAID module 128, media management layer 138 and buffer management/bus controller 114 are optional components that are not necessary in the controller 102.

Figure 2B:
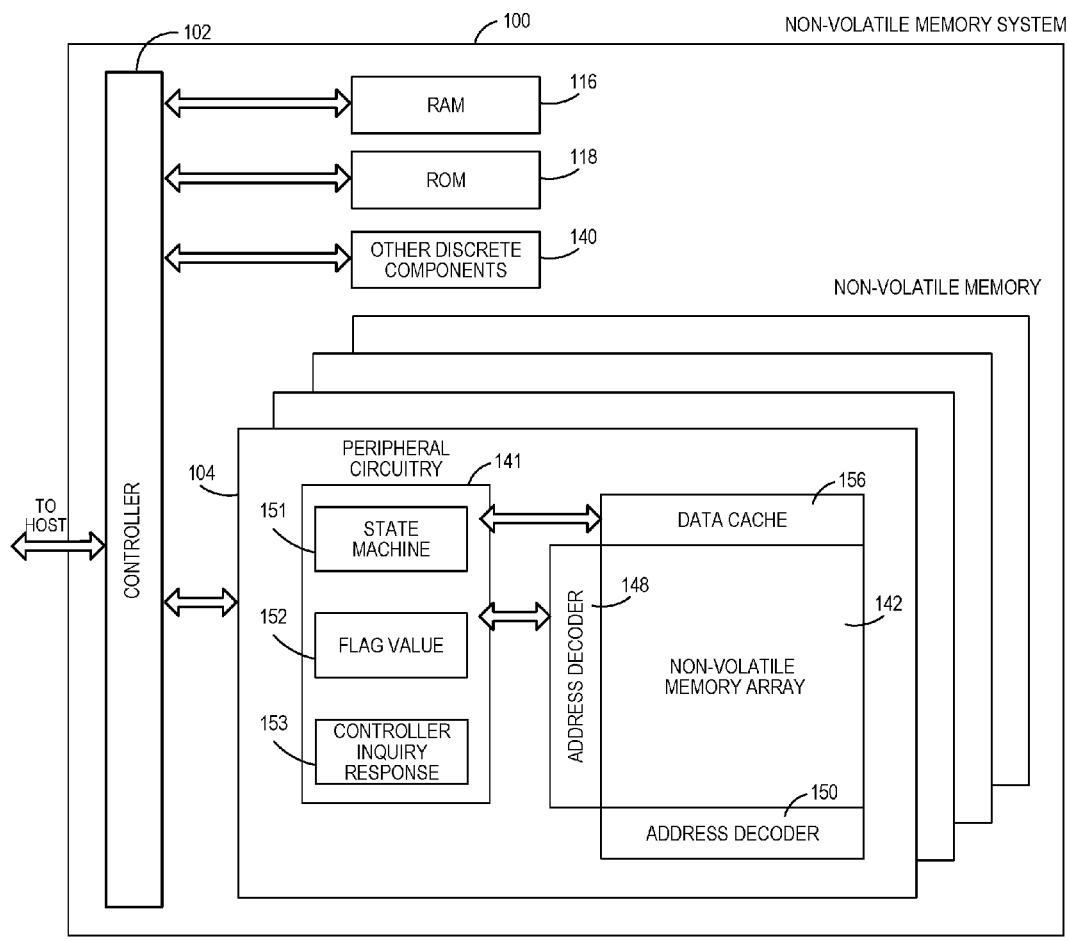
FIG. 2B is a block diagram illustrating exemplary components of a non-volatile memory of a non-volatile memory storage system.

FIG. 2B is a block diagram illustrating exemplary components of non-volatile memory die 104 in more detail.

Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 151 that provides status information to controller 102.

Non-volatile memory die may further include flag value module 152. Flag value module 152 is configured to assign values to the one or more flags indicative of the progression of execution of the command, such as execution of the write command. Along with assigning values, the flag value module 152 may store corresponding addresses.

The controller inquiry response module 153 is configured to receive an inquiry from the controller 102 (such as generated from memory chip abort inquiry module 113), and to send indicator(s) responsive to the inquiry. The indicator(s), in one embodiment, comprise value(s) of the flag(s) and associated addresses.

Non-volatile memory die 104 further includes address decoders 148, 150 for addressing within non-volatile memory array 142, and a data cache 156 that caches data.

Figure 3:
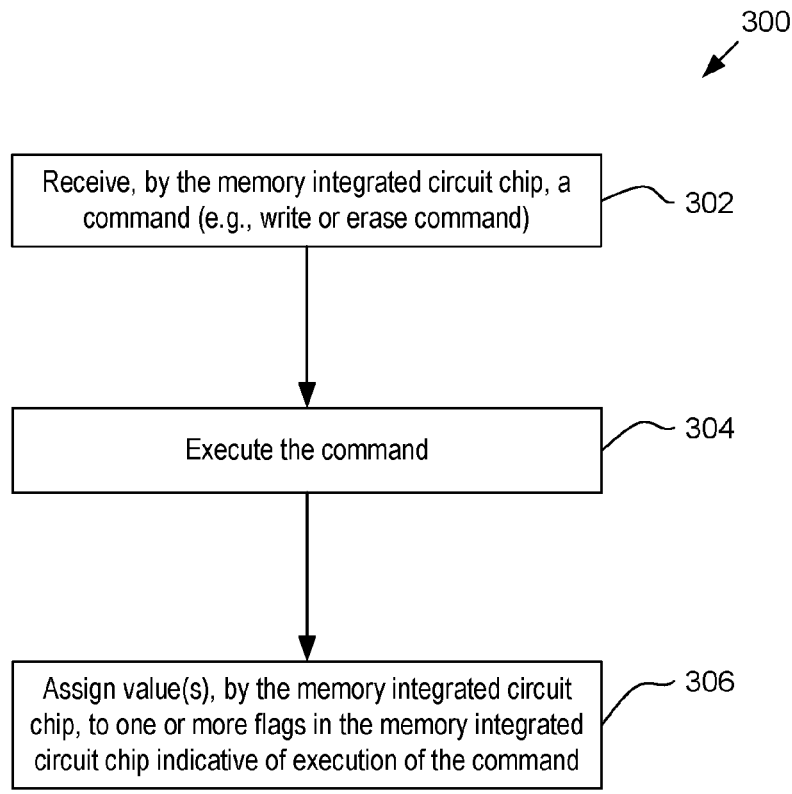
FIG. 3 illustrates a first flow chart for the memory integrated circuit chip to set one or more flags indicative of execution of a command received from the memory device controller.

FIG. 3 illustrates a first flow chart 300 for the memory integrated circuit chip to set one or more flags indicative of execution of a command received from the memory device controller. At 302, the memory integrated circuit chip a command from the memory device controller. Examples of commands include, but are not limited to, write commands or erase commands. At 304, the memory integrated circuit chip executes the command. At 306, value(s) are assigned by the memory integrated circuit chip to one or more flags that are stored in the memory integrated circuit chip. As discussed above, the flags may be resident in a high-endurance NAND area of the memory integrated circuit chip, such as SLC memory.

Figure 4:
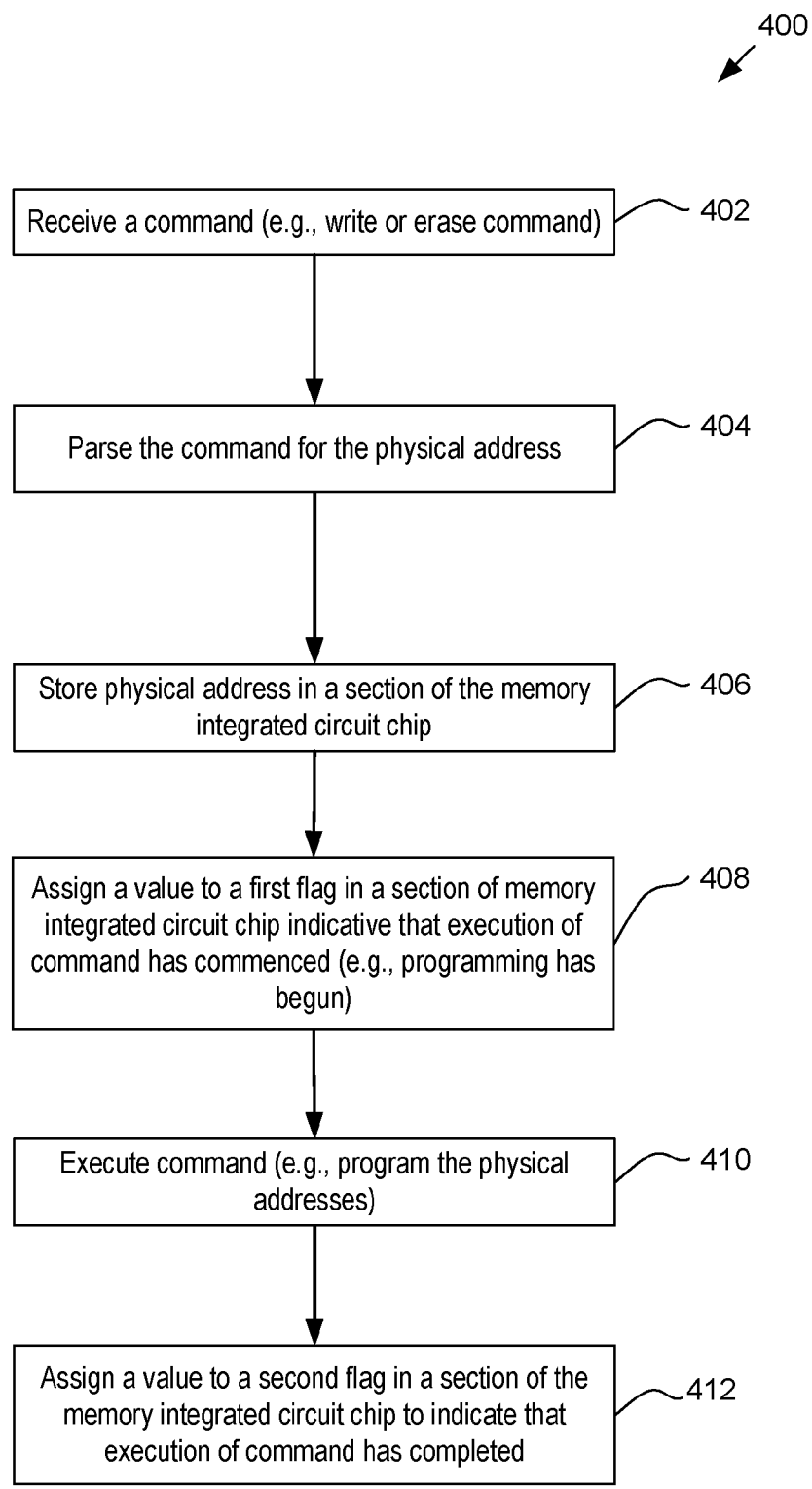
FIG. 4 illustrates a second flow chart for the memory integrated circuit chip to set one or more flags indicative of execution of a command received from the memory device controller.

FIG. 4 illustrates a second flow chart 400 for the memory integrated circuit chip to set one or more flags indicative of execution of a command received from the memory device controller. At 402, the memory integrated circuit chip a command from the memory device controller. As discussed above, the command may be indicative of a request to the memory integrated circuit chip to perform a programmed operation, such as a write program or an erase. At 404, the command is parsed for the physical address. For example, the command may a field designated for the physical address. The memory integrated circuit chip may thus access the field designated for the physical address. At 406, the memory integrated circuit chip may store the physical address in a second of the memory integrated circuit chip. In one embodiment, the memory integrated circuit chip stores the address and the flags for each programmed operation received by the memory integrated circuit chip. In an alternate embodiment, the memory integrated circuit chip stores the address and the flags only for certain programmed operation(s), such as write program operations, received by the memory integrated circuit chip.

As discussed above, one or more flags may be set to indicate an execution of the command. For example, a first flag may be programmed to indicate that the execution of the command has begun, and a second flag may be programmed to indicate that the execution of the command has completed, as illustrated in FIG. 4. In one embodiment, the first flag is the PSF (Program Started Flag) and the second flag is the PEF (Program Ended Flag), as discussed above. The value(s) assigned to the flags to indicate the stage at which the command is (whether the command has commenced or completed) may vary. In one embodiment, such as in flash memory, a value of logic "0" indicates a completion of a stage. Thus, in one embodiment, upon commencement of the command (e.g., the command has begun executing), the PSF flag may be set to logic "0". Likewise, upon completion of the command (e.g., the command has finished executing), the PEF flag may be set to logic "0". However, other value(s) to indicate the stage of the command is contemplated.

At 408, the first flag is assigned a value that indicates that the command has begun execution. After which, at 410, the command is executed. After the command has been executed by the memory (such as the memory integrated circuit chip has performed the write command, thereby programming the physical addresses stored at 406), at 412, the memory integrated circuit chip assigns a value to a second flag to indicate that the execution of the command has completed.

The memory integrated circuit chip's management of the dedicated area, including storing addresses and assigning values to flag(s), may, in one embodiment, be transparent to the memory device controller. In this regard, the memory device controller need not manage the storage of the addresses/flags and may simply request the information (e.g., addresses and associated flag values) from the memory integrated circuit chip in order to determine whether (and where) the abort occurred.

Figure 5:
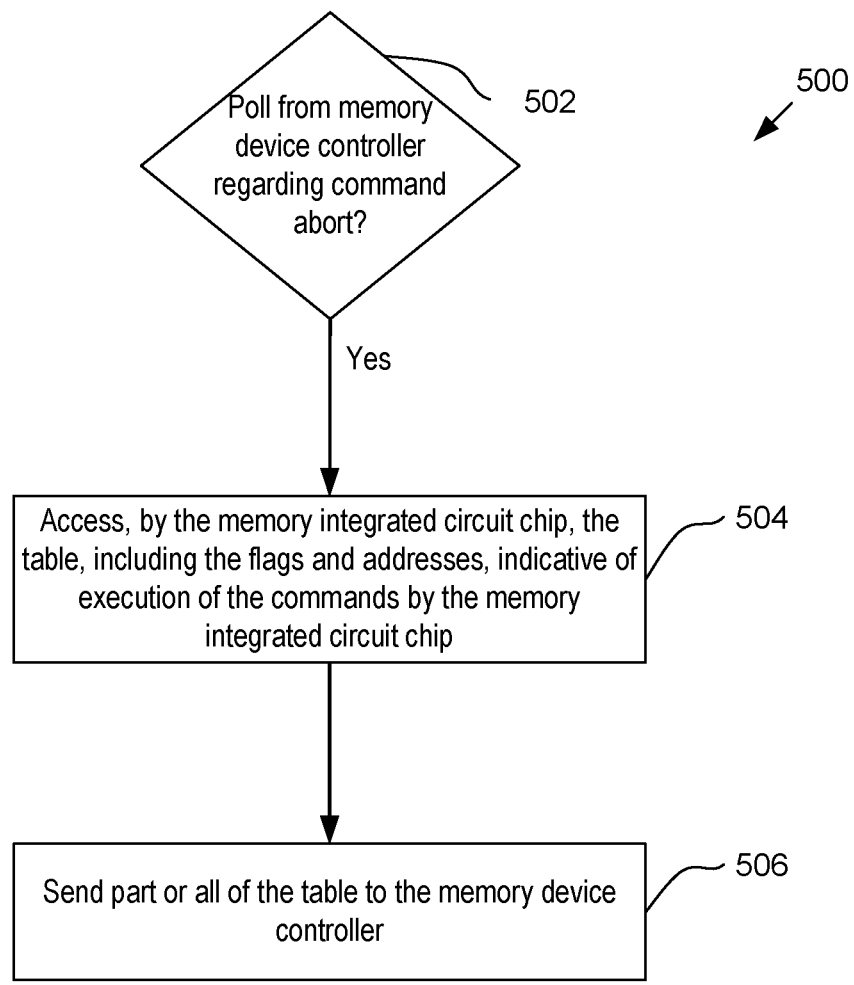
FIG. 5 illustrates a flow chart for the memory integrated circuit chip to respond to an inquiry from the memory device controller regarding a command abort.

FIG. 5 illustrates a flow chart 500 for the memory integrated circuit chip to respond to an inquiry from the memory device controller regarding a command abort. As discussed above, in one embodiment, the memory integrated circuit chip sends the one or more indicators of execution of the command in response to a poll from the memory device controller. Thus, at 502, the memory integrated circuit determines whether the memory device controller has sent a poll regarding the command abort. The poll may be in one of several forms. In one embodiment, the poll may comprise a command sent from the memory device controller to the memory integrated circuit chip, with the command including a field indicating that the command is a poll. In this regard, the poll may comprise a single command, or a series of commands.

In response to the memory integrated circuit chip determining that a poll was received from the memory device controller, at 504, the memory integrated circuit chip accesses a section of memory that includes the one or more indicators of execution of the command. In one embodiment, the one or more indicators may be resident in a table, which includes flag(s) and address(es). After which, at 506, the memory integrated circuit chip sends part of all of the indicator(s) to the memory device controller, such as part or all of the table.

Figure 6:
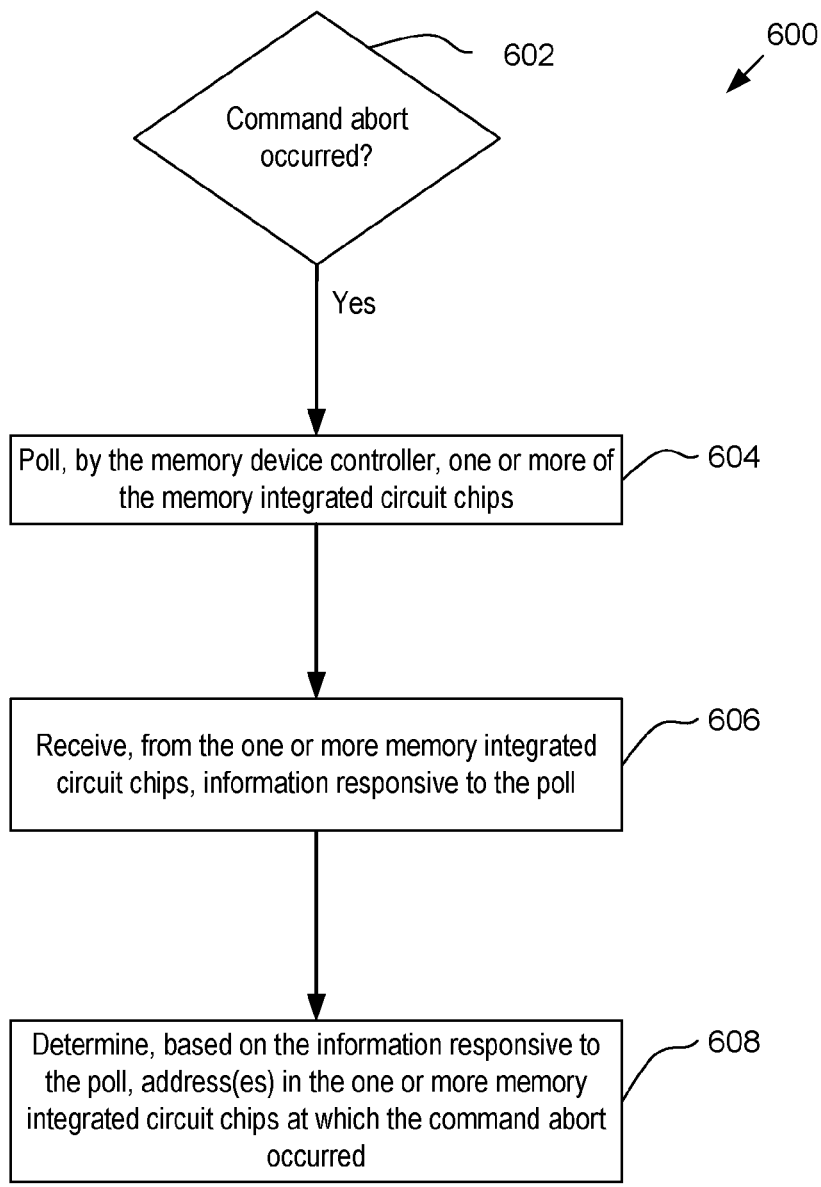
FIG. 6 illustrates a flow chart for the memory device controller to poll the memory integrated circuit chip(s) and to determine whether and where a command abort occurred.

FIG. 6 illustrates a first flow chart 600 for the memory device controller to poll the memory integrated circuit chip(s) and to determine whether and where a command abort occurred. At 602, the memory device controller determines whether a command abort has occurred. The determination as to whether a command abort has occurred may be performed in one of several ways. In one embodiment, the memory device controller may determine whether power has been removed abruptly. In response to this determination, at 604, the memory device controller may poll one or more of the memory integrated circuit chips. As discussed above, the poll may comprise a command sent to the memory integrated circuit chip(s).

At 606, the memory device controller receives from the memory integrated circuit chip(s) information responsive to the poll. The information may include, for example, flag(s) and addresses. Based on the information from the memory integrated circuit chip(s), the memory device controller may determine the state of execution of the commands when the power was interrupted. For example, the memory device controller may determine the addresses at which the command was started but not yet completed, may determine the addresses at which the command was not yet started, and/or may determine the addresses at which the command was completed. Any combinations of the state of execution of the commands is contemplated. For example, FIG. 6 illustrates the memory device controller determining, at 608, the one or more addresses at which the command was started but not yet completed. As discussed above, in one embodiment, the indicators may comprise multiple flags, such as the PSF flag and the PEF flag. The memory device controller may compare the values assigned to the PSF flag and the PEF flag to determine whether the command was started but not yet completed. Alternatively, or in addition, the memory device may compare the values assigned to the PSF flag and the PEF flag to determine whether the command was not yet started and/or completed. In this regard, the memory device controller may rely on information sent from the one or more memory integrated circuit chips to more easily determine whether (and where) a write abort occurred.

For example, in an embodiment, the memory integrated circuit chip may send the write abort indication, which may include a 1-bit flag in the form of an indication bit indicating if a write abort occurred during uncompleted write operation, followed by the history depth of last programmed pages in the NAND. Using this information, the memory device controller may extract the memory address location of the last (valid) programmed page in the blocks used at last write abort operation, or the first (non-valid) page in the used blocks.

In another embodiment, the memory integrated circuit chip may send the write abort indication, which may include a 1-bit flag in the form of an indication bit, followed by (for example 2 bits) of information that specify the memory location of the last (valid) programmed page within the used block in the device NAND memory resident in the memory integrated circuit chip. The NAND memory obtains this information from the state machine in the NAND that is fed from the memory device controller.

In the present application, semiconductor memory systems such as those described in the present application may include volatile memory systems, such as dynamic random access memory ("DRAM") or static random access memory ("SRAM") devices, non-volatile memory systems, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory system may have different configurations. For example, flash memory systems may be configured in a NAND or a NOR configuration.

The memory systems can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory system elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory systems in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory system level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory system level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory system levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory system levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory system levels. Alternatively, the memory elements may be coupled together to form a vertical NAND string that traverses across multiple horizontal memory system levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory system levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory system level of the array are typically formed on the layers of the underlying memory system levels of the array. However, layers of adjacent memory system levels of a monolithic three dimensional memory array may be shared or have intervening layers between memory system levels.

Then again, two dimensional arrays may be formed separately and then packaged together to form a non-monolithic memory system having multiple layers of memory. For example, non-monolithic stacked memories can be constructed by forming memory levels on separate substrates and then stacking the memory levels atop each other. The substrates may be thinned or removed from the memory system levels before stacking, but as the memory system levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory system.

Associated circuitry is typically required for operation of the memory elements and for communication with the memory elements. As non-limiting examples, memory systems may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:
1. A memory device controller comprising:
memory integrated circuit chip inquiry circuitry configured to send an inquiry to a memory integrated circuit chip, the inquiry indicative of requesting the memory integrated circuit chip to send one or more flag values and the associated addresses, the one or more flag values indicative of execution of a command at the associated addresses by the memory integrated circuit chip; and abort identification circuitry configured to identify, based on the one or more flag values and the associated addresses, a section of memory within the memory integrated circuit chip containing valid data resulting from proper execution of the command or invalid data resulting from aborted execution of the command.

2. The memory device controller of claim 1, wherein the memory device controller is within a memory device;

further comprising power down circuitry configured to determine whether an unexpected power down of the memory device occurred; and in response to determining that the unexpected power down of the memory device occurred, the memory integrated circuit chip inquiry circuitry is configured to send the inquiry to the memory integrated circuit chip.

3. The memory device controller of claim 2, wherein the abort identification circuitry is configured to identify a last written valid section in the memory integrated circuit chip before the unexpected power down of the memory device occurred.

4. The memory device controller of claim 3, wherein the last written valid section comprises a last valid page.

5. The memory device controller of claim 1, wherein the abort identification circuitry is configured to identify one or more blocks in the memory integrated circuit chip at which an aborted execution of the command occurred.

6. The memory device controller of claim 1, wherein the command comprises a write command; and wherein the abort identification circuitry is configured to identify a memory address location of a last valid programmed page.

7. The memory device controller of claim 1, wherein the one or more flag values comprise an indication whether execution of the command has begun.

8. The memory device controller of claim 1, wherein the one or more flag values comprise an indication that execution of the command has completed.

9. The memory device controller of claim 1, wherein the one or more flag values comprise a first flag indicative of whether execution of the command has begun and a second flag indicative of whether execution of the command has completed.

10. The memory device controller of claim 1, wherein the associated addresses comprise an indication of a page of memory.

11. A method for a memory device controller to communicate with a memory integrated circuit chip in order to determine whether a command abort has occurred, the method comprising:

performing in the memory device controller:

sending a polling command to the memory integrated circuit chip requesting information as to execution of a command by the memory integrated circuit chip;

responsive to sending the polling command, receiving address and one or more indicators indicative of the execution of the command by the memory integrated circuit chip; and determining, based on the address and the one or more indicators, a section of memory within the memory integrated circuit chip containing valid data resulting from proper execution of the command or invalid data resulting from aborted execution of the command.

12. The method of claim 11, further comprising sending the command, by the memory device controller, to the memory integrated circuit chip; and wherein the command comprises one of a write command or an erase command.

13. The method of claim 11, wherein the one or more indicators comprise an indication whether execution of the command has begun.

14. The method of claim 11, wherein the one or more indicators comprise an indication that execution of the command has completed.

15. The method of claim 11, wherein the one or more indicators comprise a first flag value indicative of whether the memory integrated circuit chip began execution of the command at the address and a second flag value indicative of whether the memory integrated circuit chip completed execution of the command at the address.

16. The method of claim 11, wherein the memory device controller is within a memory device; and wherein the memory device controller determines, based on the address and the one or more indicators, a last written valid section in the memory integrated circuit chip before an unexpected power down of the memory device occurred.

17. The method of claim 16, wherein the last written valid section comprises a last valid page.

18. The method of claim 11, wherein the memory device controller is within a memory device; and further comprising determining that an unexpected power down of the memory device occurred; and wherein, in response to determining that the unexpected power down of the memory device occurred, sending the polling command to the memory integrated circuit chip.

19. A memory device controller comprising:

means for sending an inquiry to a memory integrated circuit chip, the inquiry indicative of requesting the memory integrated circuit chip to send one or more flag values and associated addresses, the one or more flag values indicative of execution of a command at the associated addresses by the memory integrated circuit chip; and means for identifying, based on the one or more flag values and the associated addresses, a section of memory within the memory integrated circuit chip containing valid data resulting from proper execution of the command or invalid data resulting from aborted execution of the command.

20. The memory device controller of claim 19, wherein the memory device controller is within a memory device;

further comprising means for determining whether an unexpected power down of the memory device occurred; and in response to determining that the unexpected power down of the memory device occurred, the means for sending the inquiry to the memory integrated circuit chip sends the inquiry to the memory integrated circuit chip.

* * * * *